US006236244B1

(12) United States Patent
Depetro et al.

(10) Patent No.: US 6,236,244 B1
(45) Date of Patent: May 22, 2001

(54) HIGH VOLTAGE LEVEL SHIFTER FOR DRIVING AN OUTPUT STAGE

(75) Inventors: Riccardo Depetro, Domodossola; Fabrizio Martignoni, Morazzone; Enrico Scian, Cordenons, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/183,774

(22) Filed: Oct. 30, 1998

(30) Foreign Application Priority Data

Oct. 31, 1997  (EP) .................................................. 97830561

(51) Int. Cl.[7] ................................. H03B 1/00; H03B 3/00
(52) U.S. Cl. .......................... 327/108; 327/112; 327/333; 326/68
(58) Field of Search ..................................... 327/108, 110, 327/112, 170, 391, 333; 326/68, 80, 81, 83, 87

(56) References Cited

U.S. PATENT DOCUMENTS

| 5,124,579 | * | 6/1992 | Naghshineh | ............................. 326/27 |
| 5,128,555 | | 7/1992 | Millman | ................................ 307/443 |
| 5,440,258 | * | 8/1995 | Galbi et al. | ........................... 327/112 |
| 5,760,621 | * | 6/1998 | Keeth | .................................... 327/112 |
| 5,896,044 | * | 4/1999 | Walden | .................................. 326/80 |
| 6,028,574 | * | 2/2000 | Bancal | .................................... 345/74 |
| 6,087,852 | * | 7/2000 | Briggs et al. | .......................... 326/68 |

FOREIGN PATENT DOCUMENTS 0238358    9/1987    (EP) .

OTHER PUBLICATIONS

"New PMOS Pull–Up Circuit for Dual–Power Supply" *IBM Technical Disclosure Bulletin*, IBM Corporation, Armonk, New York, Jun. 1993, pp. 183–185.

* cited by examiner

Primary Examiner—Terry D. Cunningham
Assistant Examiner—Quan Tra
(74) *Attorney, Agent, or Firm*—Theodore E. Galanthay; Charles J. Rupnick; Seed IP Law Group PLLC

(57) ABSTRACT

The invention relates to an electronic level shifter circuit for driving a high-voltage output stage. This output stage comprises a complementary pair of transistors connected between first and second supply voltage references, and at least one PMOS pull-up transistor connected in series with an NMOS pull-down transistor. An additional transistor is connected in parallel with the pull-up transistor, and the driver circuit has a first output connected to the control terminal of the pull-up transistor and a second output connected to the control terminal of the additional transistor.

14 Claims, 3 Drawing Sheets

HIGH VOLTAGE LEVEL SHIFTER FOR DRIVING AN OUTPUT STAGE

TECHNICAL FIELD

This invention relates to an electronic level shifter circuit for driving a high-voltage output power stage.

More particularly, the invention relates to an electronic level shifter circuit for driving a high-voltage output stage, said stage comprising a complementary pair of transistors connected between first and second supply voltage references, and including at least one PMOS pull-up transistor connected in series to an NMOS pull-down transistor.

BACKGROUND OF THE INVENTION

As is well known, a final output stage of a generic electronic circuit basically includes a drive portion intended for powering a load whichever. Thus, the output stage should be capable of draining or taking up current from the load, according to necessity and the type of application involved.

Countless configurations have been proposed in the prior art for the output stage. FIG. 1 attached hereto shows schematically one of the commonest of such output stage configurations.

The stage shown in FIG. 1 comprises a complementary pair of MOS transistors connected in series with each other, between a first voltage reference Vdd and a second voltage reference Vss, wherein the latter may either be a negative supply or a ground.

Complementary pairs of MOS transistors are those more often employed in output stages on account of the definite advantages that they afford in the respect of control logics; however, the considerations made herein below would also apply to output stage configurations incorporating bipolar transistors or any other pairs of MOS transistors.

The first transistor M7 in the complementary pair is a pull-down transistor of either the NMOS or the DMOS type, and has its body terminal connected to the source terminal.

The second transistor M6 in the complementary pair is a pull-up transistor of the thin oxide PMOS type, and has its body terminal connected to the source terminal.

The transistors M6 and M7 are connected to each other through their respective drain terminals, which terminals coincide with an output node OUT. An electric load, not shown, is connected between the output node OUT and ground.

The electric load is driven alternately by the PMOS transistor M6 or the NMOS transistor M7, according to whether the operation phase is one of sourcing or of sinking.

Respective driving stages have their respective outputs connected to the gate terminals of the transistors M6 and M7. Only the driving stage of the PMOS transistor M6 is shown in FIG. 1.

FIG. 2 shows a second example of an output stage incorporating a pair of NMOS and PMOS transistors M15 and M23. These transistors are again connected together at the output node OUT, and a driving stage of greater complexity than in the previous example of FIG. 1 is provided for the PMOS transistor M23.

FIG. 3 shows schematically a further embodiment wherein all the PMOS transistors shown in FIG. 2 are replaced with similar thick oxide PMOS power transistors.

SUMMARY OF THE INVENTION

For many applications, output stages which can operate in both low driving voltage and high driving voltage conditions would be desirable.

However, the prior art provides no solutions which can efficiently fill the demand in terms of performance as well as of reduced occupation of circuit area.

An embodiment of this invention provides an output stage and associated level shifting driver circuit with such respective functional and structural features as to be usable in low- and high-voltage applications and to have reduced circuit area requirements.

The embodiment provides an output stage which incorporates both a thin gate oxide PMOS transistor and a thick field oxide PMOS transistor, and of having both transistors driven from the same level shifting driver circuit.

Features and advantages of the this invention will be apparent from the following description of an embodiment thereof, given by way of non-limitative example with reference to the accompanying drawings.

DETAILED DESCRIPTION OF THE INVENTION

Figure 5:
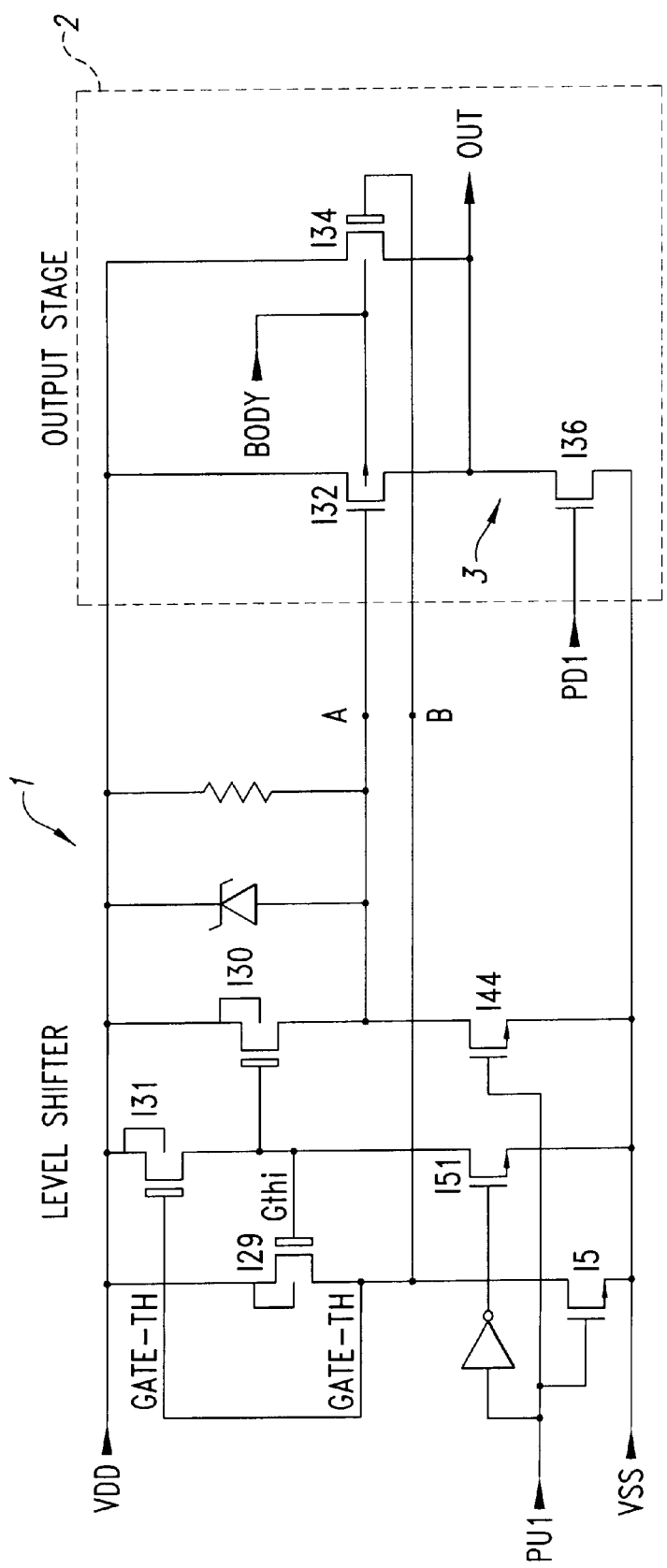
FIG. 5 is a schematic view of an output stage and associated driver circuit according to this invention.

Referring to the drawing figures, in particular to the example of FIG. 5, generally and schematically shown at 1 is a level shifter circuit for use, in accordance with this invention, with a final output stage 2 of an electronic circuit.

The stage 2 is a power stage intended for driving an electric load connected between an output node OUT of the stage 2 and ground, for example.

The stage 2 is shown in detail in FIG. 5 as comprising preferably a complementary pair 3 of MOS transistors I32, I36 and a third MOS transistor I34.

The transistors in the pair 3 are connected in series with each other, between a first voltage reference Vdd and a second voltage reference Vss, it being possible for the latter to either be a negative supply or ground.

The first transistor I36 in the complementary pair 3 is a pull-down transistor of the NMOS type having its source terminal connected to the second supply voltage reference Vss and its gate terminal arranged to receive a signal PD1.

The second transistor I32 in the complementary pair 3 is a pull-up transistor of the thin oxide PMOS type. This transistor I32 is connected in parallel with the third transistor I34 and has its source terminal connected to the first supply voltage reference Vdd and its body terminal connected to the body terminal of the third transistor I34.

In a preferred embodiment, these two body terminals can be formed in the semiconductor, in common with the transistors I32 and I34 inserted into the same well in the semiconductor, with the source and drain terminals in common.

The transistors I36 and I32 are connected to each other through their respective drain terminals being coincident with the output node OUT.

Advantageously, the third transistor I34 is a thick oxide PMOS power transistor, and has its source and drain terminals connected to the first voltage reference Vdd and the output node OUT, respectively.

The gate terminal of the first PMOS transistor I32 is connected to a first output A of the driver circuit 1, and the gate terminal of the third PMOS transistor I34 is connected to a second output B of the driver circuit 1.

The driver circuit 1 can be classed essentially as a high-voltage level shifter which transfers the logic information to the three MOS switches I32, I34 and I36.

Figure 1:
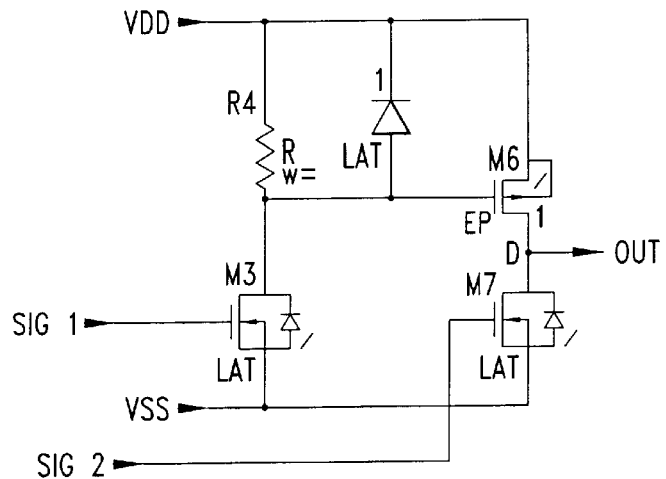
FIGS. 1, 2 and 3 are respective schematic views of final output stages according to the prior art, as driven by respective driver circuits.
Figure 2:
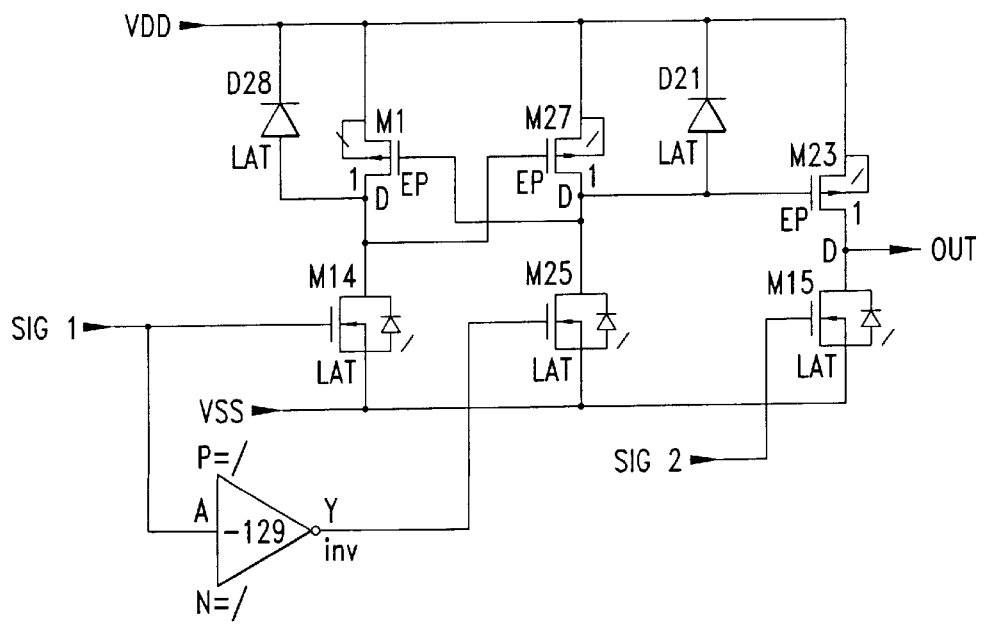
Figure 3:
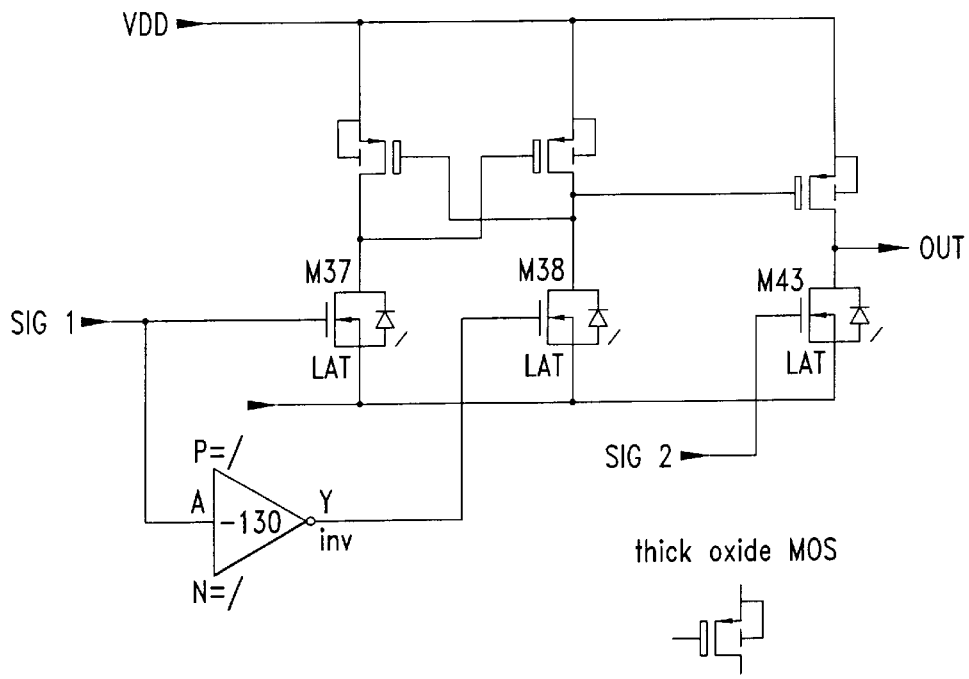
Figure 4:
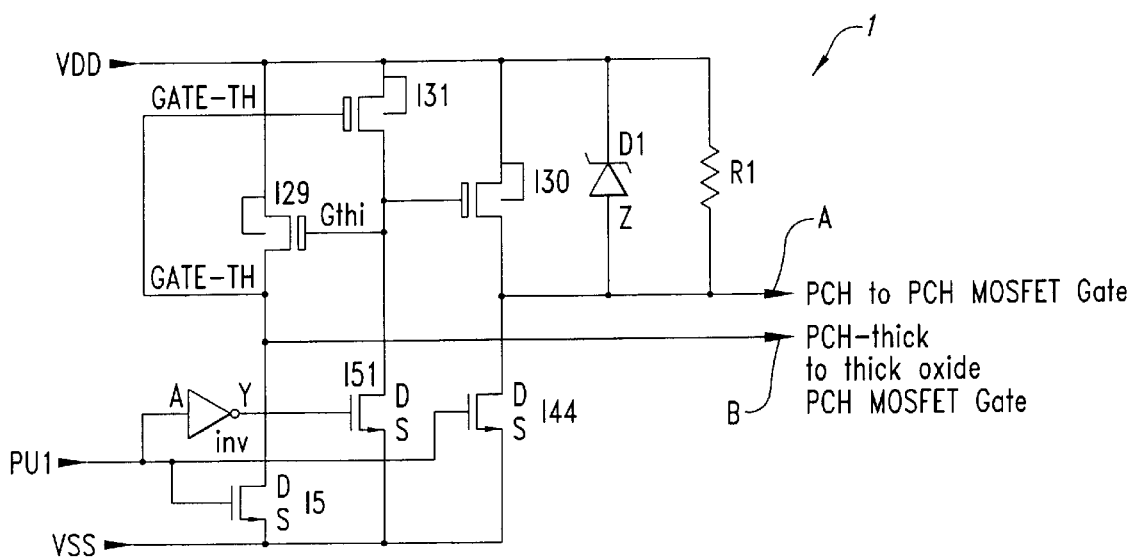
FIG. 4 is a schematic view of a driver circuit according to this invention.

FIG. 4 is a more detailed view of the internal construction of the driver circuit 1, which comprises a shifter circuit stage equipped with a differential cell level shifter comprising a pair of DMOS input transistors I44 and I51. An input signal PU1 is applied to the transistor I44 directly, and in inverted form to the transistor I51 via an inverter INV.

The differential cell of the circuit 1 has on its output a pair of thick oxide PMOS power transistors I30, I31. The first output transistor I30 is connected in series with the input transistor I44 and forms a complementary pair therewith. The transistor I30 has its drain terminal connected to the drain of the DMOS transistor I44, to form the first output A of the circuit 1, which output is connected to the gate of the transistor I32 in the stage 2.

A parallel circuit of a Zener diode D1 and a resistor R1 is provided between this output A and the first supply reference Vdd.

The PMOS transistor I30 has its source terminal connected to the first supply reference Vdd and its body terminal connected to the source terminal.

The gate of the transistor I30 is connected to the drain terminal of the second output transistor I31 forming a second complementary pair with the second input transistor I51.

The transistor I31 is a thick oxide PMOS transistor, and has its drain terminal connected to the drain of the transistor I51, its source terminal connected to the first supply reference Vdd, and its body terminal connected to the source terminal.

The construction of the circuit 1 is completed by an additional transistor I29 of the thick oxide PMOS type, which transistor has its source terminal connected to the first supply reference Vdd and its body terminal connected to the source terminal. The gate terminal of the transistor I29 is referenced Gthi in the figure and is connected to the gate terminal of the transistor I30, as well as to the drain terminal of the transistor I31.

The drain terminal of the transistor I29 is connected to the drain terminal of an NMOS transistor I5 to form the second output B of the circuit 1 for driving the control terminal of the thick oxide transistor I34 in the output stage. The signal produced on the output B will be referenced GATE_TH hereinafter.

The output node B is also connected to the gate terminal of the transistor I31.

In addition, the source terminal of the transistor I5 is in common with the source terminals of the transistors I44 and I51, and receives the second reference potential Vss.

The gate terminal of the transistor I5 receives directly the same control signal PU1 as the transistor I44.

The foregoing structure is but a non-limitative example given to illustrate a possible application. This structure is not binding for the invention operation.

The operation of the driver circuit 1 according to the invention will now be described.

Advantageously, the circuit 1 can operate on either a constant supply or a pulsive type of supply, that is with the voltage Vdd oscillating between the ground value and a relatively high positive value, and with the voltage Vss oscillating between the ground value and a relatively high negative value.

In the constant supply case, the voltages are kept stable, and the output stage 2 allows the load to be applied either the voltage Vdd or the voltage Vss.

The PMOS transistors I32 and I34 in the output stage 2, once enabled, allow a voltage to be applied to the node OUT for powering the load.

When the signal PU1 is at a low logic value, the transistor I44 is in the off state, and the transistor I51 is turned on. This situation allows the gate terminal Gthi to fall as much as possible toward the voltage value Vss, thereby allowing the transistor I30 to be turned on with a very strong overdrive on the threshold voltage.

At this point, the gate terminal of the PMOS transistor I32 will go to a lower voltage than the threshold voltage, and turn off this transistor. The transistor I30 of the circuit 1 is suitably sized to provide a voltage drop from Vdd effective to turn off the transistor I32.

The third transistor I34 in the output stage 2 receives the control signal GATE_TH, which is pulled to a high logic value toward the supply Vdd by the action of the transistor I29 driven by the signal Gthi.

It is interesting to observe that the output stage 2 contains no protection elements, such as are instead provided between the gate terminal of the transistor I32 and the supply Vdd as parts of the circuit 1. The zener Z1 and resistor R1 allow the maximum variation of the voltage applied to the gate terminal of the transistor I32 to be clamped.

As the signal PU1 goes to a high logic value, the transistors I44 and I5 are activated, and the transistor I51 is turned off. Presented to the gate terminal Gthi is a high logic signal impressed by the transistor I31, which transistor has its gate terminal subjected to a rapid fall of potential GATE_TH due to the action of the transistor I5, suitably sized for this purpose.

As the signal Gthi rises, the transistor I30 tends to go off, thereby forcing the first output A to a value of potential which is dependent essentially on the presence of the zener Z1.

The value of potential of the second output B will also be changed, because of the signal GATE_TH being brought close to the value Vss.

During the power-off phase, in order to discharge voltage from the output load, or to connect the load to a negative voltage, it will be sufficient that the PMOS transistor of the circuit 1 be deactivated by bringing the signal PU1 to a low logic value and activate the power transistor I36 in the stage 2 by pulling the signal PD1 high.

The circuit 1 may also be operated in a pulsed mode, by activating the signal PU1 before the raising of the supply Vdd pulse.

In this way, both PMOS transistors I32 and I34 will be activated upon the supply voltage Vdd being raised over their threshold voltage. During this first operation phase, the body terminals of both transistors would be connected to the supply Vdd, e.g., as described in a U.S. patent application entitled High Voltage Output Stage For Driving An Electric Load filed herewith under attorney docket number 856063.553, which is incorporated herein by reference.

In view of the different physical constructions of the transistors I32 and I34 in parallel, their threshold voltages are different due to the oxide thicknesses, and only one of them will be activated initially.

But upon the value of the supply Vdd reaching its maximum, the voltage at the body terminal may be brought over the maximum supply voltage such that a possible current loop-back is enabled without the parasitic elements of either transistor becoming activated.

This arrangement is particularly advantageous in that some of the current from the load can be recovered and redirected to the supply.

During the negative pulse half-wave, the signal PD1 is activated with the transistors I32 and I34 held in the off state. Consequently, the DMOS transistor I36 will be turned on, thereby allowing the output to follow the negative voltage Vss.

What is claimed is:

1. An electronic circuit comprising:
   a high-voltage output stage that includes a first complementary pair of transistors connected between first and second supply voltage references, the first complementary pair including at least one PMOS pull-up transistor having a conduction terminal connected to a conduction terminal of an NMOS pull-down transistor, wherein said output stage comprises an additional transistor connected in parallel with the pull-up transistor; and
   a level shifter circuit having a first output connected to the control terminal of the pull-up transistor and a second output connected to the control terminal of said additional transistor, the level shifter circuit including a parallel circuit of a Zener diode and a resistor connected between said first output and the first supply voltage reference.

2. A circuit according to claim 1, wherein said first output is an interconnection node of a second complementary pair of transistors, connected between said first and second voltage references and wherein the pull-up transistor is a power transistor.

3. An electronic level shifter circuit for driving a high-voltage output stage that includes a complementary pair of transistors connected between first and second supply voltage references, the complementary pair including at least one PMOS pull-up transistor having a conduction terminal connected to a conduction terminal of an NMOS pull-down transistor, wherein said level shifter circuit has a first output connected to the control terminal of the pull-up transistor and a second output connected to the control terminal of an additional transistor connected in parallel with the pull-up transit, wherein said leve shifter circuit further comprises a differential cell level shifting stage comprising a pair of MOS input transistors receiving an input signal and an inverted input signal, respectively, the inverted input signal being an inversion of the input signal, said differential cell level shifting stage having an output portion with a set of power transistors connected to the MOS input transistors.

4. A circuit according to claim 3, wherein said output portion comprises a first PMOS transistor connected in series at the first output with a first one of the MOS input transistors to form a first complementary pair therewith.

5. A circuit according to claim 4, wherein said output portion further comprises a second power transistor connected in series at an interconnection node with the second input transistor to form a second complementary pair, a third power transistor being arranged with its control terminal connected to the interconnection node between the transistors of said second complementary pair and a conduction terminal forming said second output of the level shifter circuit connected to said additional transistor in the output stage.

6. A circuit according to claim 3, wherein the power transistors of said output portion are all thick oxide PMOS transistors.

7. A circuit according to claim 5, wherein the control terminal of said second power transistor is connected to said second output.

8. A driver circuit for driving a load, comprising:
   a high-voltage output stage having first and second output transistors connected in parallel between a first supply voltage reference and an output node, each output transistor having a control terminal; and
   a level shifter having a first logical input, a first output coupled to the control terminal of the first transistor and a second output coupled to the control terminal of the second transistor, each of the level shifter outputs being responsive to the first logical input, wherein the level shifter includes a first complementary pair of transistors having first and second transistors connected between the first supply voltage reference and a second supply voltage reference and a second complementary pair of transistors having third and fourth transistors connected between the first and second supply voltage references, the second transistor of the first complementary pair of transistors having a control terminal connected to a conduction terminal of the fourth transistor of the second complementary pair of transistors and the fourth transistor having a control terminal connected to the conduction terminal of the second transistor;
   a third complementary pair of transistors connected between the first and second supply voltage references, the third complementary pair including fifth and sixth transistors connected to each other at the first output, the sixth transistor including a control terminal connected to the conduction terminal of the fourth transistor of the second pair of transistors; and
   the first and fifth transistors each include a control terminal coupled to the first logical input, and the third transistor is coupled to the first logical input by an inverter.

9. The driver circuit of claim 8 wherein the output stage also includes a third output transistor having a first terminal connected to the output node, a second terminal connected to the second supply voltage reference, and a control terminal responsive to a second logical input.

10. A driver circuit for driving a load, comprising:
    a high-voltage output stage having first and second output transistors connected in parallel between a first supply voltage reference and an output node each output transistor having a control terminal; and
    a level shifter having a first logical input, a first output coupled to the control terminal of the first transistor and a second output coupled to the control terminal of the second transistor, each of the level shifter outputs being responsive to the first logical input, wherein the level shifting circuit includes a Zener diode and a resistor connected in parallel between the first output and the first supply voltage reference.

11. A method of driving a load using a high-voltage output stage having first and second output transistors connected in parallel between a first supply voltage reference and an output node, each output transistor having a control terminal, the method comprising:
    receiving a first logical input signal;
    producing a level shifted first output signal in response to the first logical input signal;
    producing a level shifted second output signal in response to the first logical input signal;

driving the control terminal of the first output transistor with the first output signal; and driving the control terminal of the second output transistor with the second output signal, wherein the act of producing the first output signal includes turning on a first power switch to electrically connect the control terminal of the first output transistor to the first supply voltage reference and the act of producing the second output signal includes turning on a second power switch to electrically connect the control terminal of the second output transistor to the first supply voltage reference.

12. The method of claim 11 wherein the acts of turning on the first and second power switches includes turning on an input switch to electrically connect control terminals of the first and second power switches to a second supply voltage reference.

13. The method of claim 11 wherein the act of producing the first output signal includes turning on a first input switch to electrically connect the control terminal of the first output transistor to a second supply voltage reference and the act of producing the second output signal includes turning on a second input switch to electrically connect the control terminal of the second output transistor to the second supply voltage reference.

14. A method of driving a load using a high-voltage output stage having first and second output transistors connected in parallel between a first supply voltage reference and an output node, each output transistor having a control terminal, the method comprising:

receiving a first logical input signal;

producing a level shifted first output signal in response to the first logical input signal;

producing a level shifted second output signal in response to the first logical input signal;

driving the control terminal of the first output transistor with the first output signal;

driving the control terminal of the second output transistor with the second output signal;

providing a first power switch connected between the first input switch and the first supply voltage reference, and a second power switch connected between the second input switch and the first supply voltage reference; and turning on a control switch in response to the first logical signal being at a first state, the turned on control switch maintaining both of the first and second power switches in an off condition.

* * * * *

UNITED STATES PATENT AND TRADEMARK OFFICE
CERTIFICATE OF CORRECTION

PATENT NO. : 6,236,244 B1
DATED : May 22, 2001
INVENTOR(S) : Riccardo Depetro et al.

It is certified that error appears in the above-identified patent and that said Letters Patent is hereby corrected as shown below:

Column 5, claim 3,
Line 47, "wherein said leve shifter" should read -- wherein said level shifter -- on the issued patent.

Signed and Sealed this

Twelfth Day of March, 2002

Attest:

Attesting Officer

JAMES E. ROGAN
Director of the United States Patent and Trademark Office